United States Patent
Wang et al.

(10) Patent No.: US 7,137,085 B1
(45) Date of Patent: Nov. 14, 2006

(54) WAFER LEVEL GLOBAL BITMAP CHARACTERIZATION IN INTEGRATED CIRCUIT TECHNOLOGY DEVELOPMENT

(75) Inventors: John J. Wang, San Jose, CA (US); Siu May Ho, Sunnyvale, CA (US); Jeffrey P. Erhardt, San Jose, CA (US); Srikanth Sundararajan, Sunnyvale, CA (US); David C. Newbury, Saratoga, CA (US); Shivananda S. Shetty, Sunnyvale, CA (US); Paul J. Steffan, Elk Grove, CA (US); Franklyn Shihyu Wu, Berkeley, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 177 days.

(21) Appl. No.: 10/858,739

(22) Filed: Jun. 1, 2004

(51) Int. Cl.
*G06F 17/50* (2006.01)

(52) U.S. Cl. .................... 716/4; 365/232; 703/13; 714/27; 714/30; 714/724

(58) Field of Classification Search ............... 716/4; 714/27, 30, 724; 703/13; 365/232
See application file for complete search history.

(56) References Cited

U.S. PATENT DOCUMENTS

| 6,185,707 | B1* | 2/2001 | Smith et al. ............... 714/724 |
| 6,336,086 | B1* | 1/2002 | Perez et al. ................ 703/13 |
| 6,367,040 | B1* | 4/2002 | Ott et al. .................. 714/724 |
| 6,745,370 | B1* | 6/2004 | Segal et al. ................ 716/2 |
| 6,775,817 | B1* | 8/2004 | Ono et al. .................. 716/21 |
| 6,842,866 | B1* | 1/2005 | Song et al. ................. 714/37 |
| 2002/0199136 | A1* | 12/2002 | Ku ........................... 714/30 |
| 2004/0083407 | A1* | 4/2004 | Song et al. ................. 714/27 |
| 2004/0233767 | A1* | 11/2004 | Wu et al. ................... 365/232 |
| 2005/0097500 | A1* | 5/2005 | Ye et al. .................... 716/20 |

* cited by examiner

*Primary Examiner*—A. M. Thompson
*Assistant Examiner*—Nelson Lam
(74) *Attorney, Agent, or Firm*—Mikio Ishimaru

(57) ABSTRACT

A system and method for wafer level global bitmap characterization include determining chip level defect data bitmaps from a semiconductor wafer, and consolidating the chip level defect data bitmaps into a global wafer level bitmap that characterizes substantially the entire wafer failure configuration. The global wafer level bitmap is then analyzed and compared with other global wafer level bitmaps to develop correlations thereamong and develop global wafer level bitmap definitions for conducting at least one of wafer-to-wafer, boat-to-boat, and lot-to-lot process analysis based upon the global wafer level bitmap definitions.

20 Claims, 3 Drawing Sheets

WAFER LEVEL GLOBAL BITMAP CHARACTERIZATION IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

At the present time, electronic products are used in almost every aspect of life, and the heart of these electronic products is the integrated circuit. Integrated circuits are used in a wide variety of products, such as televisions, telephones, and appliances.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers in processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes. To reduce costs, only a few wafers are actually processed for each cycle. This research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems. For example, during the production of semiconductor devices, in-line defect inspections are conducted at various times to obtain defect data about the devices. In-line defects are detected by inspection techniques that are conducted between the process steps that fabricate the semiconductor devices. Actual defects are then determined later using various tests after the semiconductor chip fabrication is completed. The defect data is typically collected by electrical testing, by laser scanning, by optical inspection, or by a scanning electron microscope.

Defects may include many different events that may have very different respective impacts on chip yield. Any irregularities, such as structural imperfections, particles, residuals, or embedded foreign material, are considered as defects, along with electrical performance defects.

The inspection techniques often result in a total count of the number of defects detected in each process step, as well as the physical locations of the defects, but not an abundance of in-depth or specific defect data. Total count and location information alone has generally not been sufficient for assigning good yield loss projections to defects detected at each particular process step, nor for correcting and adjusting process operations to reduce or eliminate the defects.

Nevertheless, semiconductor testing is needed for quality control of manufacturing processes and of the products themselves. Typical testing reveals both the types of defects and their locations on the semiconductor wafer. Fail locations during tests on a chip are then typically reported as X-Y coordinates, which are then consolidated into a map called a "bitmap". This leads to full bitmap techniques or fail vector techniques that may be used to generate and record locations of failures.

Since speed is also critical for efficient manufacturing, it is important to be able to analyze all the test data quickly. Unfortunately, reviewing all the inspected defects, even using known automated classification, can significantly delay yield learning cycles and the subsequent manufacturing process adjustments and corrections for the semiconductor devices.

The challenge is compounded by the additional process data that is generated by the ordinary measuring and testing that is performed during semiconductor fabrication processing. This includes, for example, wafer, die, and wafer lot parameters that are generated during fabrication and post-fabrication measuring and testing.

Correspondingly, the better the inspections during production, the better the data that can then potentially shorten yield learning cycles by making it possible to react quickly to process problems. The process engineer therefore needs to know the number of defects per chip, the X-Y coordinates of each defect, and a set of parameters (different for different tools) that are specific for each particular defect. To obtain yield impact projections, it is then desirable to correlate the actual defect data to actual electrical failures. Such data can be crucial for adjusting manufacturing process parameters to maximize the yields of a product.

However, conventional wafer bitmaps are at the individual chip and bit level. In a production facility, on the other hand, data at the wafer, boat, and/or the lot level would be more meaningful for defect analysis. There is thus a need in production environments to enable wafer, boat, and/or lot level bitmap comparison rather than comparison at the conventional individual bit level. Preferably, bitmap comparison at such elevated levels would provide wafer level global bitmap characterization for improving and accelerating integrated circuit technology development.

Such wafer level global bitmap characterization could provide systems and methods that can use the results from these various tests to quickly compare the wafers, boats, and/or wafer lots. Satisfying these needs would then enable the rapid correlation of defect data and yield data among the wafers, boats, and wafer lots to assist in finding cause-and-effect relationships between process conditions and the measured chip characteristics and parameters. This in turn would provide for rapidly determining appropriate process adjustments and corrections for improving process yields and quality.

Solutions to these problems have been long sought but prior developments have not taught or suggested any solutions and, thus, solutions to these problems have long eluded those skilled in the art.

DISCLOSURE OF THE INVENTION

The present invention provides a system and method for wafer level global bitmap characterization. Chip level defect data bitmaps are determined from a semiconductor wafer, and the chip level defect data bitmaps are consolidated into a global wafer level bitmap that characterizes substantially the entire wafer failure configuration. The global wafer level bitmap is then analyzed and compared with other global wafer level bitmaps to develop correlations thereamong and develop global wafer level bitmap definitions for conducting at least one of wafer-to-wafer, boat-to-boat, and lot-to-lot process analysis based upon the global wafer level bitmap definitions. This enables wafer level global bitmap comparison for comparing wafer-to-wafer, boat-to-boat, and/or lot-to-lot, based on wafer bitmap definitions, thereby allowing for production monitoring and lot yield improvement.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

The present invention provides a method and system that enable wafer level and/or lot level global bitmap comparison rather than conventional comparison at the individual bit level.

Figure 1:
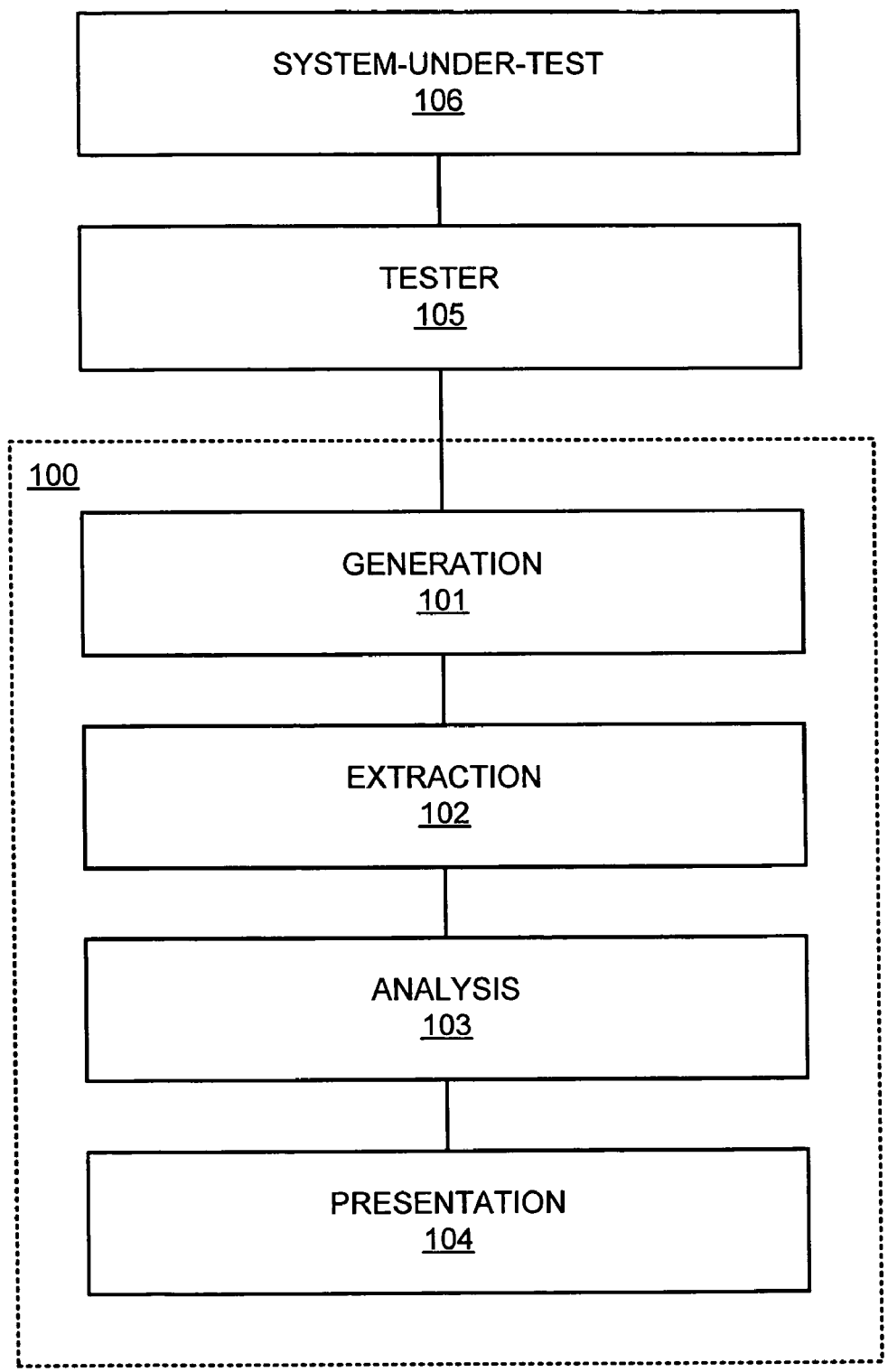
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die, and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, conventional test information, a personal computer, and so forth. It may also require new equipment and/or methods, which are described herein when required.

In the extraction block 102, usable information is extracted from the generated information from the generation block 101. Essentially, the generated information is translated into forms that are more useful; e.g., broken apart so that it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points were determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

In the production of semiconductor devices, each process step must be developed and stabilized as quickly as possible. It is therefore essential to perform failure analysis rapidly, efficiently, and effectively, so that the results of the failure analysis can facilitate quick repair of the process defect that caused the failure.

Various kinds of failure analysis are performed with respect to each individual semiconductor device. In one process, a "bitmap signature", or simply "bitmap", is generated in which the distribution condition of defects on a chip is mapped in accordance with the arrangement of the subject semiconductor devices.

With the development of very large scale integration ("VLSI") devices, and ever larger and larger wafers, such bitmaps have developed into data structures holding vast amounts of data. Identification of failure modes has become correspondingly more complicated. Furthermore, when analyzing the causes of the defects, the occurrence conditions are typically analyzed for each individual fail bit. Therefore, as the bitmaps become larger, the bitmap processing time greatly increases, and analysis efficiency is correspondingly greatly reduced. Accordingly, methods and analytical procedures are needed for rapidly relating this data to process conditions that can be associated with other similarly constituted fail bit configurations.

Figure 2:
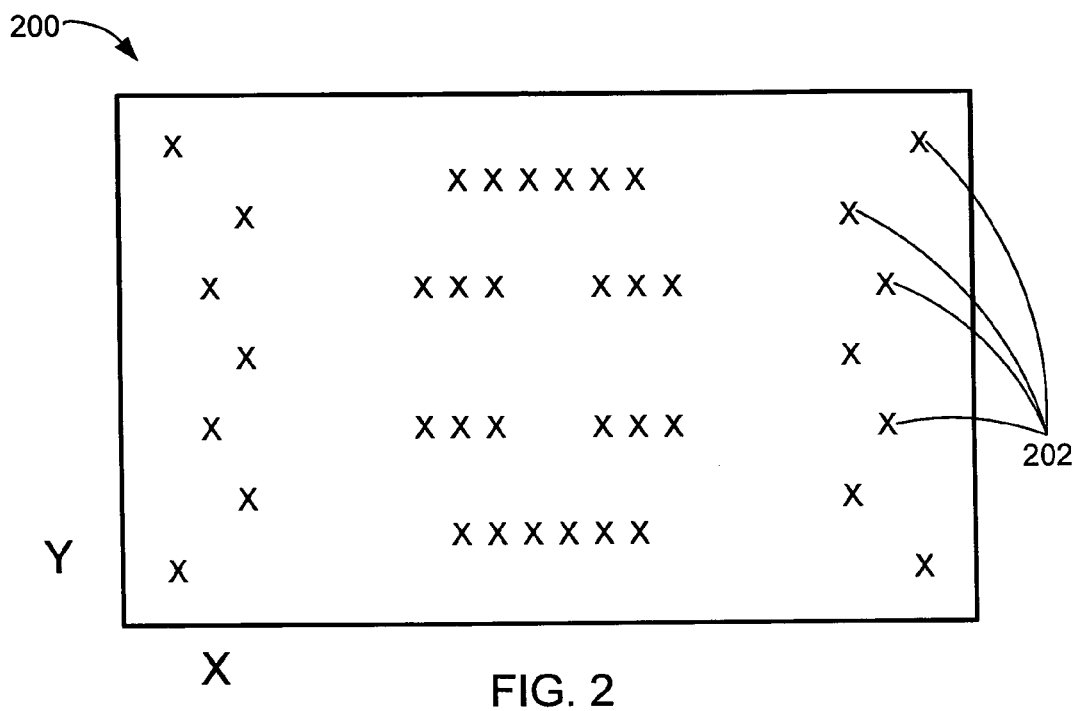
FIG. 2 is a portion of an X-Y bitmap of defects on a chip.

Referring now to FIG. 2, therein is shown a portion of an X-Y bitmap 200 of defects on a chip. In the X-Y bitmap 200, the locations of the defects are depicted on the X-Y grid in the locations in the array designated by crosses 202. The crosses 202 correlate to the defect locations on the related semiconductor chip (not shown).

Figure 3:
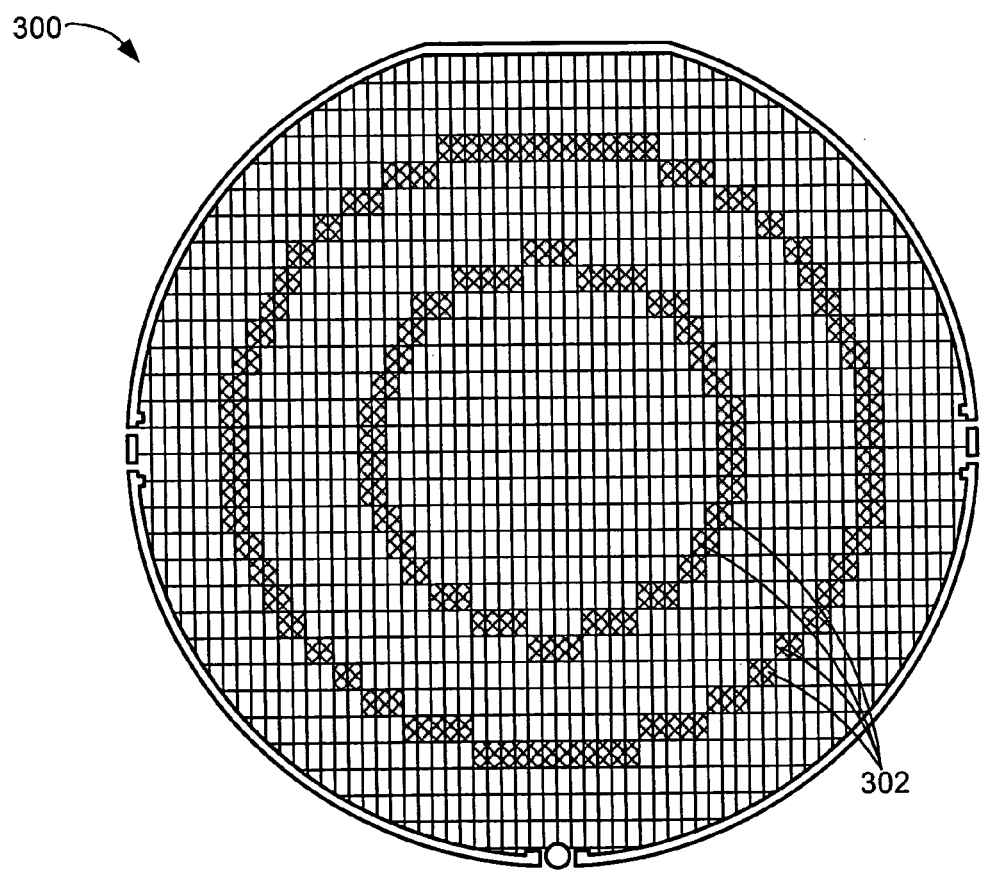
FIG. 3 shows a global wafer level bitmap.

Referring now to FIG. 3, therein is shown a global wafer level bitmap 300 of the defects in a semiconductor wafer containing the chips that produced chip-level defect X-Y bitmaps such as the X-Y bitmap 200 (FIG. 2). The global wafer level bitmap 300 results from the unexpected discovery that defect signal analysis in a production facility can be made far more meaningfully and effectively by consolidating the defect data bitmaps from a wafer's individual chip X-Y bitmaps 200 (FIG. 2), into a single, global wafer level bitmap 300. Such a global wafer level bitmap 300 directly facilitates and enables bitmap comparisons for conducting wafer-to-wafer, boat-to-boat, and/or lot-to-lot process analyses based upon resulting consolidated, global wafer level bitmap definitions.

As shown in FIG. 3, the global wafer level bitmap 300 is actually a spatial pattern, presenting a spatial geography of all the defects on the corresponding wafer. For simplicity of illustration, not every defect is actually depicted in FIG. 3. Instead, certain regions have crosses 302 thereon to represent bitmap areas of higher defect densities. In actual practice, the level or degree of detail will be much more extensive, with every defect data point typically included. Therefore, the drawing as shown in FIG. 3 will be understood to correspond to a simplified spatial representation of an actual global wafer level bitmap.

Thus, the global wafer level bitmap 300, in one embodiment, consolidates all the chip level defect data into a single, significantly more massive bitmap that characterizes the entire wafer failure configuration. This global bitmap is then analyzed and compared with other such global wafer level bitmaps 300 to develop correlations thereamong, according to the particular production processes and products under consideration. That is, the bitmap definitions are generated by comparing their spatial patterns and signatures across wafers, wafer boats, and/or wafer lots, and correlating the spatial patterns with failure bit patterns and associated process conditions and configurations. Such correlations, as will now be understood by those having ordinary skill in this art, will then indicate certain identifiable bitmap definitions or signatures that can be assigned to each global wafer level bitmap 300.

In some processes, there may be but a few such bitmap definitions that will suffice to characterize the range of global wafer level bitmap patterns or signatures of interest. In other process environments, the appropriate number of relevant bitmap definitions may range to many more orders of magnitude. It will be understood, therefore, that the bitmap definitions for categorizing the global wafer level bitmaps 300 will be constructed according to the needs and analytical results of the resulting bitmap signatures for each of the particular process environments and circumstances of interest.

A method according to the present invention thus correlates semiconductor wafer defect data with known prior process data. The wafer and the chips thereon are the system-under-test 106 (FIG. 1). The tester 105 then tests the wafer to detect defects, generating defect data at the chip level by means of circuitry therefor in the generation block 101.

Circuitry in the extraction block 102 then consolidates the chip level defect data into the global wafer level bitmap 300 (FIG. 3).

Next, circuitry in the analysis block 103 performs defect signal analysis to identify spatial patterns in the spatial geography of the global wafer level bitmap 300. This spatial signature analysis results in the assignment of a bitmap definition to the global wafer level bitmap 300.

Finally, circuitry in the presentation block 104 enables the bitmap definitions to be correlated with other bitmap definitions associated with various known process and failure bit modes for ready and rapid determination at the wafer, boat, and/or lot levels, as needed or desired.

The method thus provides faster and more meaningful defect signal analysis by correlating related wafer level global bitmap process signature definitions of semiconductor devices that have been treated by a semiconductor manufacturing process. The correlation then predicts that the causes of current defects and process data at the wafer-to-wafer, boat-to-boat, and lot-to-lot levels correspond to the known causes for other global bitmap patterns that have similar bitmap spatial signature analysis classifications and assigned bitmap definitions.

Yield learning cycles are therefore accelerated by the present invention, defect causes are more quickly identified, and corrective yield impact projections are promptly and accurately generated. The result is much faster and more accurate analyses that advantageously avoid current limitations such as manual classification, pre-defined (and thus potentially limiting) sets of classification codes, intensive computation, and so forth. The corresponding manufacturing process problems are then corrected and optimized more quickly, and process yields are correspondingly improved more rapidly.

Figure 4:
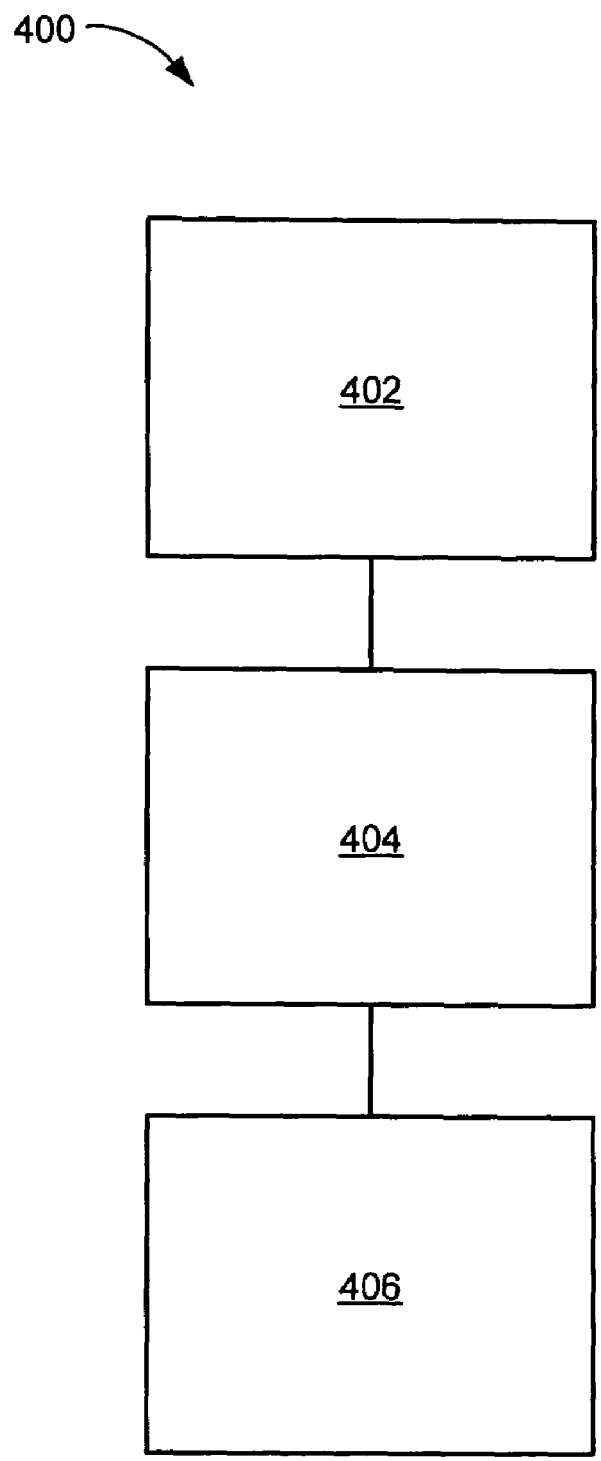
FIG. 4 is a flow chart of a method for wafer level global bitmap characterization in accordance with the present invention.

Referring now to FIG. 4, therein is shown a flow chart of a method 400 for wafer level global bitmap characterization in accordance with the present invention. The method 400 includes determining chip level defect data bitmaps from a semiconductor wafer in a block 402; consolidating the chip level defect data bitmaps into a global wafer level bitmap that characterizes substantially the entire wafer failure configuration in a block 404; and analyzing and comparing the global wafer level bitmap with other global wafer level bitmaps to develop correlations thereamong and develop global wafer level bitmap definitions for conducting at least one of wafer-to-wafer, boat-to-boat, and lot-to-lot process analysis based upon the global wafer level bitmap definitions in a block 406.

The present invention thus enables global wafer level bitmap comparison to compare wafer-to-wafer, boat-to-boat, and/or lot-to-lot based on the bitmap definitions. Accordingly, it has been discovered that the wafer level global bitmap characterization method and apparatus of the present invention furnish important and heretofore unavailable solutions, capabilities, and functional advantages for integrated circuit technology development. The resulting processes and configurations are straightforward, economical, uncomplicated, highly versatile and effective, use conventional technologies, and are thus fully compatible with conventional semiconductor manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method for wafer level global bitmap characterization, comprising:
   determining chip level defect data bitmaps from a semiconductor wafer;
   consolidating the chip level defect data bitmaps into a global wafer level bitmap that characterizes substantially the entire wafer failure configuration; and
   analyzing and comparing the global wafer level bitmap with other global wafer level bitmaps to develop correlations thereamong and develop global wafer level bitmap definitions for conducting at least one of wafer-to-wafer, boat-to-boat, and lot-to-lot process analysis based upon the global wafer level bitmap definitions.

2. The method of claim 1 wherein determining chip level defect data bitmaps further comprises:
   testing the wafer and the chips thereon; and
   generating defect data at the chip level.

3. The method of claim 1 further comprising correlating related global wafer level bitmap definitions of at least one of semiconductor wafers, boats, and lots that have been treated by a semiconductor manufacturing process.

4. The method of claim 1 further comprising:
   performing defect signal analysis on the global wafer level bitmap to identify spatial patterns in the spatial geography of the global wafer level bitmap; and
   assigning a global wafer level bitmap definition to the global wafer level bitmap.

5. The method of claim 1 further comprising correlating the bitmap definitions with other bitmap definitions associated with known process and failure bit modes for determination thereof at at least one of the wafer, boat, and lot levels.

6. A method for wafer level global bitmap characterization, comprising:
   testing chips on a semiconductor wafer to determine individual chip level defect data bitmaps;
   consolidating the chip level defect data bitmaps from the semiconductor wafer individual chip level defect data bitmaps into a single, global wafer level bitmap that characterizes the entire wafer failure configuration, to generate a spatial pattern presenting a spatial geography of substantially all the defects on the wafer;
   generating global bitmap process signature definitions by comparing such spatial patterns across at least one of wafers, wafer boats, and wafer lots, and correlating the spatial patterns with failure bit patterns and associated process conditions and configurations;
   from the correlating, indicating and assigning an identifiable global bitmap process signature definition for categorizing the global wafer level bitmap; and
   predicting from the assigned global bitmap process signature definition that the causes of the defect data at at least one of wafer-to-wafer, boat-to-boat, and lot-to-lot levels correspond to known causes for other global wafer level bitmap patterns that have similar assigned global bitmap process signature definitions.

7. The method of claim 6 wherein determining individual chip level defect data bitmaps further comprises:
   testing the wafer and the chips thereon; and
   generating defect data at the chip level.

8. The method of claim 6 further comprising correlating related global wafer level bitmap definitions of at least one of semiconductor wafers, boats, and lots that have been treated by a semiconductor manufacturing process.

9. The method of claim 6 further comprising:
   performing defect signal analysis on the global wafer level bitmap to identify spatial patterns in the spatial geography of the global wafer level bitmap; and
   assigning a global wafer level bitmap definition to the global wafer level bitmap.

10. The method of claim 6 further comprising correlating the bitmap definitions with other bitmap definitions associated with known process and failure bit modes for determination thereof at at least one of the wafer, boat, and lot levels.

11. A system for wafer level global bitmap characterization, comprising:
    means for determining chip level defect data bitmaps from a semiconductor wafer;
    circuitry for consolidating the chip level defect data bitmaps into a global wafer level bitmap that characterizes substantially the entire wafer failure configuration; and
    circuitry for analyzing and comparing the global wafer level bitmap with other global wafer level bitmaps to develop correlations thereamong and develop global wafer level bitmap definitions for conducting at least one of wafer-to-wafer, boat-to-boat, and lot-to-lot process analysis based upon the global wafer level bitmap definitions.

12. The system of claim 11 wherein the means for determining chip level defect data bitmaps further comprises:
- means for testing the wafer and the chips thereon; and
- means for generating defect data at the chip level.

13. The system of claim 11 further comprising circuitry for correlating related global wafer level bitmap definitions of at least one of semiconductor wafers, boats, and lots that have been treated by a semiconductor manufacturing process.

14. The system of claim 11 further comprising:
- circuitry for performing defect signal analysis on the global wafer level bitmap to identify spatial patterns in the spatial geography of the global wafer level bitmap; and
- circuitry for assigning a global wafer level bitmap definition to the global wafer level bitmap.

15. The system of claim 11 further comprising circuitry for correlating the bitmap definitions with other bitmap definitions associated with known process and failure bit modes for determination thereof at at least one of the wafer, boat, and lot levels.

16. A system for wafer level global bitmap characterization, comprising:
- means for testing chips on a semiconductor wafer to determine individual chip level defect data bitmaps;
- circuitry for consolidating the chip level defect data bitmaps from the semiconductor wafer individual chip level defect data bitmaps into a single, global wafer level bitmap that characterizes the entire wafer failure configuration, to generate a spatial pattern presenting a spatial geography of substantially all the defects on the wafer;
- circuitry for generating global bitmap process signature definitions by comparing such spatial patterns across at least one of wafers, wafer boats, and wafer lots, and correlating the spatial patterns with failure bit patterns and associated process conditions and configurations;
- circuitry for indicating and assigning, from the correlated spatial patterns, an identifiable global bitmap process signature definition for categorizing the global wafer level bitmap; and
- circuitry for predicting from the assigned global bitmap process signature definition that the causes of the defect data at at least one of wafer-to-wafer, boat-to-boat, and lot-to-lot levels correspond to known causes for other global wafer level bitmap patterns that have similar assigned global bitmap process signature definitions.

17. The system of claim 16 wherein the means for determining individual chip level defect data bitmaps further comprises:
- means for testing the wafer and the chips thereon; and
- means for generating defect data at the chip level.

18. The system of claim 16 further comprising circuitry for correlating related global wafer level bitmap definitions of at least one of semiconductor wafers, boats, and lots that have been treated by a semiconductor manufacturing process.

19. The system of claim 16 further comprising:
- circuitry for performing defect signal analysis on the global wafer level bitmap to identify spatial patterns in the spatial geography of the global wafer level bitmap; and
- circuitry for assigning a global wafer level bitmap definition to the global wafer level bitmap.

20. The system of claim 16 further comprising circuitry for correlating the bitmap definitions with other bitmap definitions associated with known process and failure bit modes for determination thereof at at least one of the wafer, boat, and lot levels.

* * * * *